US010332763B2

(12) United States Patent
Serebryanov et al.

(10) Patent No.: US 10,332,763 B2
(45) Date of Patent: Jun. 25, 2019

(54) LAMP DRIVER FOR LOW PRESSURE ENVIRONMENT

(71) Applicant: Applied Materials, Inc., Santa Clara, CA (US)

(72) Inventors: Oleg V. Serebryanov, San Jose, CA (US); Alexander Goldin, San Jose, CA (US); Joseph M. Ranish, San Jose, CA (US)

(73) Assignee: APPLIED MATERIALS, INCL, Santa Clara, CA (US)

( * ) Notice: Subject to any disclaimer, the term of this patent is extended or adjusted under 35 U.S.C. 154(b) by 433 days.

(21) Appl. No.: 14/987,378

(22) Filed: Jan. 4, 2016

(65) Prior Publication Data
US 2016/0196992 A1 Jul. 7, 2016

Related U.S. Application Data

(60) Provisional application No. 62/099,993, filed on Jan. 5, 2015.

(51) Int. Cl.
*H05B 3/02* (2006.01)
*H01L 21/67* (2006.01)
(Continued)

(52) U.S. Cl.
CPC .... *H01L 21/67115* (2013.01); *F27B 17/0025* (2013.01)

(58) Field of Classification Search
CPC ........... F27B 17/0025; H01L 21/67098; H01L 21/67115; H01L 21/67242; H01L 21/67248
(Continued)

(56) References Cited

U.S. PATENT DOCUMENTS 6,805,466 B1 * 10/2004 Ranish .............. H01L 21/67115
219/405
7,586,762 B2 * 9/2009 Hsu ........................ G09G 3/3406
315/160
(Continued)

FOREIGN PATENT DOCUMENTS

CN 102150248 A 8/2010
JP 59-047303 A 3/1984

OTHER PUBLICATIONS

Y. Nishida, et. al., A new 3-phase Buck-Boost Unity Power Factor Rectifier with Two Independently Controlled DC Outputs, Applied Power Electronics Conference, APEC 2007—Twenty Second Annual IEEE, 7 pp.
(Continued)

*Primary Examiner* — Sang Y Paik
(74) *Attorney, Agent, or Firm* — Patterson + Sheridan LLP

(57) ABSTRACT

Embodiments of the present disclosure relate to a lamp driver for lamps used as a source of heat radiation in a thermal processing chamber. The lamp driver includes a power source, at least two DC/DC converters, each DC/DC converter connected with the power source in series, a direct connection between the at least two DC/DC converters, and a line that is attached to the direct connection and attachable to a reference voltage. A plurality of the lamp drivers may be utilized to power a plurality of lamps positioned in a grounded lamphead assembly. The electrical potential between the lamps and the grounded lamphead assembly is reduced, which reduces the risk of arcing between the lamps and the lamphead assembly.

11 Claims, 5 Drawing Sheets

(51) Int. Cl.
*F27B 17/00* (2006.01)
*F26B 3/30* (2006.01)

(58) Field of Classification Search
USPC .......... 219/482–490, 408–414; 392/407–425
See application file for complete search history.

(56) References Cited

U.S. PATENT DOCUMENTS

| | | | |
|---|---|---|---|
| 8,289,741 B2 * | 10/2012 | Jungreis | H02M 7/219 363/65 |
| 2006/0223315 A1 * | 10/2006 | Yokota | H01L 21/0214 438/689 |
| 2010/0059497 A1 | 3/2010 | Ranish et al. | |
| 2012/0031332 A1 | 2/2012 | Yokota et al. | |
| 2013/0287377 A1 | 10/2013 | Serebryanov et al. | |
| 2014/0027440 A1 | 1/2014 | Goldin et al. | |
| 2014/0028212 A1 | 1/2014 | Chuang et al. | |

OTHER PUBLICATIONS

Singh, et al; Review of IPQCs; IEEE Transactions on Industrial Electronics, vol. 51, No. 3 Jun. 2004, 4 pp.
Muriel; 12 Volt Dual Power Supply Circuit; dated Sep. 25, 2012; 2 total pages.
PCT Notification of Transmittal of the International Search Report and the Written Opinion of the International Searching Authority for International Application No. PCT/US2016/012057; dated Apr. 22, 2016; 13 total pages.
Chinese Office Action (with attached English translation) for Application No. 201670003959.8; dated Nov. 1, 2018; 14 total pages.

* cited by examiner

LAMP DRIVER FOR LOW PRESSURE ENVIRONMENT

CROSS-REFERENCE TO RELATED APPLICATIONS

This application claims priority to U.S. Provisional Patent Application Ser. No. 62/099,993, filed on Jan. 5, 2015, which herein is incorporated by reference.

BACKGROUND

Field

Embodiments of the present disclosure generally relate to an apparatus for thermally processing a substrate. In particular, embodiments of the present disclosure relate to a lamp driver for lamps used as a source of radiation in a thermal processing chamber.

Description of the Related Art

Rapid thermal processing (RTP) is a semiconductor manufacturing process for heating silicon substrates at high temperatures, often 1200 degrees Celsius or greater, in a relatively short period of time, for example, in several seconds or less. The heating is often achieved using high intensity lamps positioned in a lamphead assembly, which is not in fluid communication with a processing region. The lamphead assembly may be operated at a reduced pressure which matches the pressure in the processing region. At the reduced pressure, the minimum break down voltage for pressure controlling gases is low, which increases the risk of arcing between the lamps and the lamphead assembly.

Therefore, an improved lamp driver is needed.

SUMMARY

Embodiments of the present disclosure relate to a lamp driver for lamps used as a source of heat radiation in a thermal processing chamber. The lamp driver includes a power source, at least two DC/DC converters, each DC/DC converter connected with the power source in series, a direct connection between the at least two DC/DC converters, and a line that is attached to the direct connection and attachable to a reference voltage. A plurality of the lamp drivers may be utilized to power a plurality of lamps positioned in a grounded lamphead assembly. The electrical potential between the lamps and the grounded lamphead assembly is reduced, which reduces the risk of arcing between the lamps and the lamphead assembly.

In one embodiment, a lamp driver includes a power source, at least two direct current to direct current converters, each direct current converter connected with the power source in series, a direct connection between the at least two direct current to direct current converters, and a line attached to the direct connection and attachable to a reference voltage.

In another embodiment, a thermal processing apparatus includes a plurality of lamps positioned in a lamphead assembly, and one or more lamp drivers, each lamp driver of the one or more lamp drivers is connected to one or more lamps of the plurality of lamps, and the one or more lamp drivers each includes a power source, at least two direct current to direct current converters, each direct current converter connected with the power source in series, a direct connection between the at least two direct current to direct current converters, and a line attached to the direct connection and attachable to a reference voltage.

In another embodiment, a method for powering a plurality of lamps positioned in a lamphead assembly includes converting a 480 V alternating current voltage from a power source to a direct current voltage, reducing the direct current voltage to a reduced direct current voltage using at least two direct current to direct current converters, wherein the at least two direct current to direct current converters each connected with the power source in series, a direct connection between the at least two direct current to direct current converters is attached to a line connected to a reference voltage. The method further includes supplying the reduced direct current voltage to one or more lamps of the plurality of lamps, and a maximum electrical potential between the plurality of lamps and the lamphead assembly is about 100 V.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
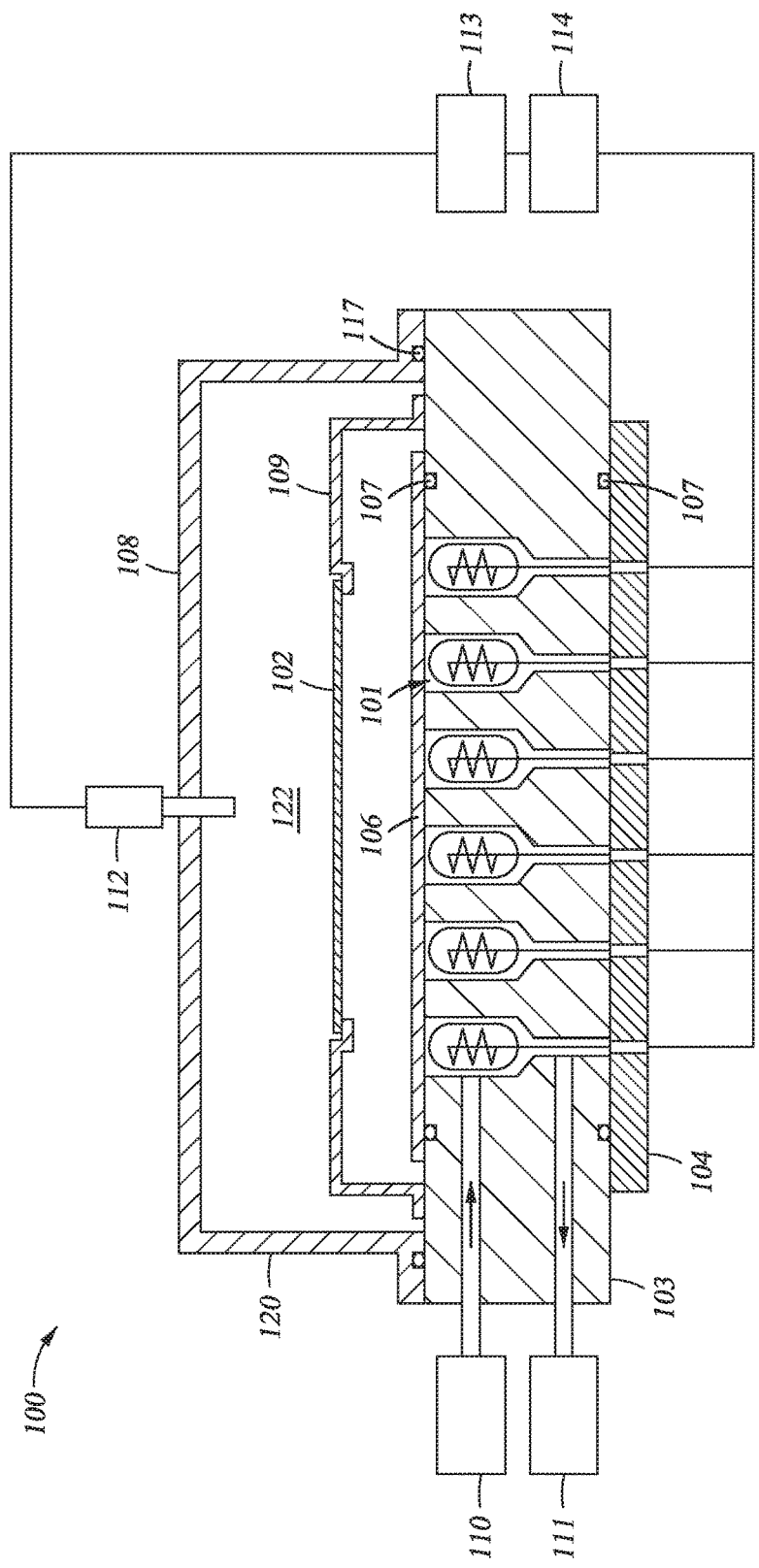
FIG. 1 is a schematic, cross-sectional view of a thermal processing chamber according to one embodiment.

FIG. 1 is a schematic, cross-sectional view of a thermal processing chamber 100. The thermal processing chamber 100 may be an RTP chamber, an epitaxial deposition chamber, or any other suitable thermal processing chamber. As shown in FIG. 1, the thermal processing chamber 100 includes a chamber body 120 and a lamphead assembly 103 disposed below the chamber body 120. The chamber body 120 may include a top 108 and a bottom 106. The bottom 106 may be a quartz window. A substrate support 109 may be disposed between the top 108 and the bottom 106 for supporting a substrate 102. A processing region 122 may be defined by the top 108 and the substrate support 109. A plurality of lamps 101 positioned in a lamphead assembly 103 may be disposed below the bottom 106 for heating the substrate 102. The plurality of lamps 101 may be any suitable lamps, such as halogen lamps. Pressure inside the lamphead assembly 103 may be controlled by a gas source 110 and a vacuum pump 111. The pressure inside the lamphead assembly 103 may be the same as the pressure in the processing region 122. In one embodiment, the pressure in the processing region 122 and in the lamphead assembly 103 is between about $1\times10^{-5}$ Torr and about 10 Torr. The gas flowing out of the gas source 110 for controlling the pressure inside the lamphead assembly 103 may be any suitable inert gas, such as helium. The inert gas used to control the pressure inside the lamphead assembly 103 may also be used to cool the lamphead assembly 103. The lamphead assembly 103 may include a cooling channel (shown in FIG. 2) formed therein for flowing a coolant, such as water, therethrough.

A power distribution board 104 may be disposed below the lamphead assembly 103 to distribute power to the plurality of lamps 101 from one or more lamp drivers 114. Words such as below, above, up, down, top, and bottom described herein may not refer to absolute directions, but may refer to directions relative to basis of the thermal processing chamber 100. Gaps between the bottom dome 106 and the lamphead assembly 103 and between the power distribution board 104 and the lamphead assembly 103 may be sealed by seals 107, 117. One or more temperature sensors 112, such as pyrometers, may be utilized to measure the temperature of the substrate 102, and based on the temperature measured by the one or more temperature sensors 112, a temperature controller 113 may set the output voltage of the one or more lamp drivers 114. In one embodiment, the plurality of lamps 101 includes a plurality of sets of two lamps connected in series in order to reduce the current flowing to the lamphead assembly, and one lamp driver 114 is connected to each set of two lamps that are connected in series. In another embodiment, one lamp driver 114 is connected to each lamp 101 of the plurality of lamps 101.

Figure 2:
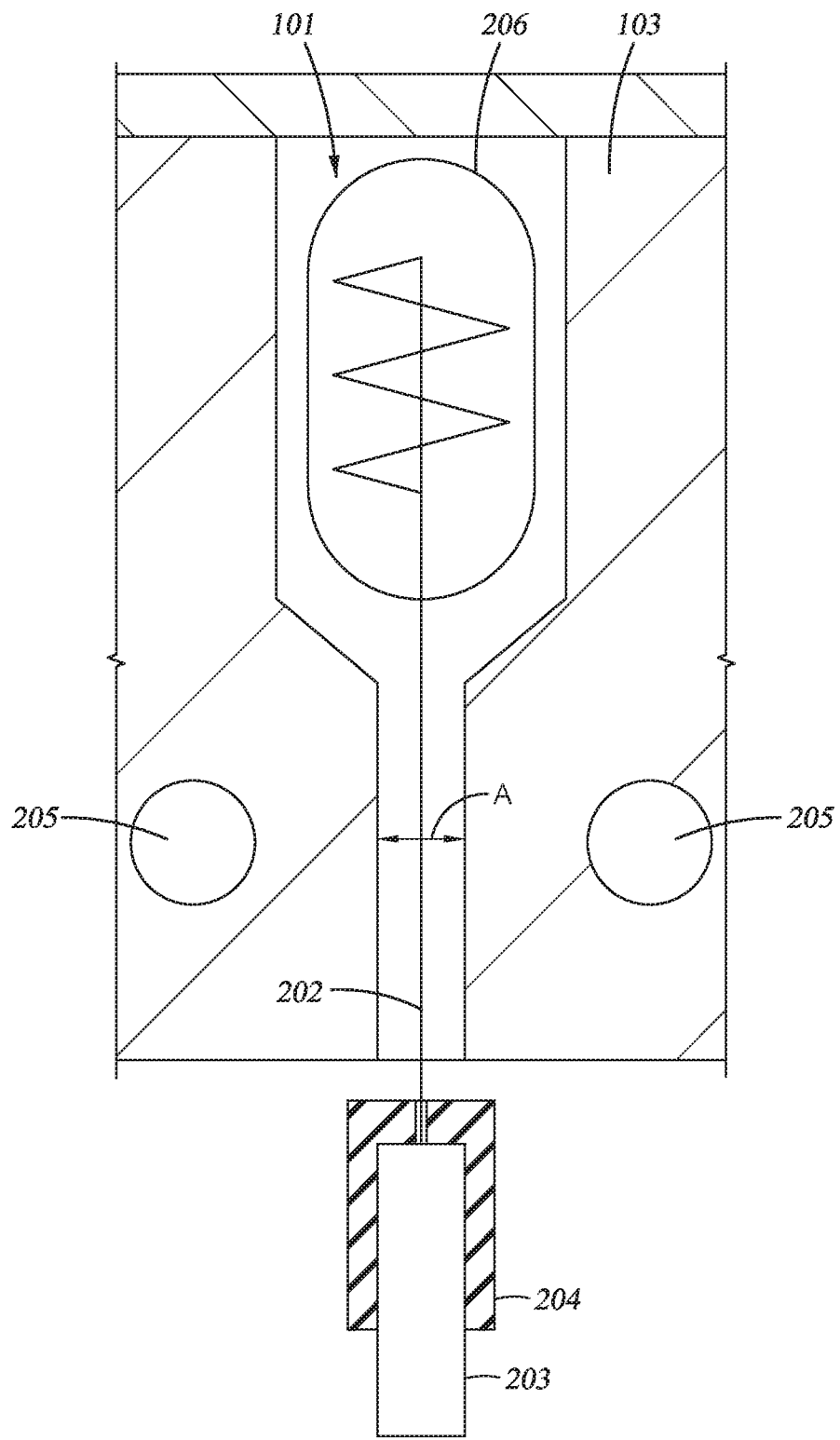
FIG. 2 is a schematic, cross-sectional view of a lamp positioned in a lamphead assembly according to one embodiment.

Typically, a lamp, such as a halogen lamp, has a bulb portion and a base portion supporting the bulb portion. The base portion may have a dimension, such as a diameter, that is at least the same as a dimension of the bulb portion. As a typical lamp is positioned in a lamphead assembly, the area dedicated to the base portion of the typical lamp may be substantially the same as the area dedicated to the bulb portion of the typical lamp. In order to maximize cooling efficiency of the lamphead assembly, the area dedicated to the base portion may be reduced. Cooling efficiency of the lamphead assembly is defined by the gap between the lamp and the lamphead assembly. One method of reducing the area dedicated to the base portion of the typical lamp is to utilize baseless lamps for the plurality of lamps 101. FIG. 2 illustrates an example of the baseless lamp 101 positioned in the lamphead assembly 103.

FIG. 2 is a schematic, cross-sectional view of a lamp 101 positioned in the lamphead assembly 103. The lamp 101 shown in FIG. 2 is a baseless lamp, but a lamp having a base portion may be used in other embodiments, as described above. The lamp 101 may include a bulb portion 206 and a lead 202 extending from the bulb portion 206. The lead 202 may be connected to a pin 203 which is connected to the power distribution board 104 (shown in FIG. 1). The pin 203 may be held by an insulator 204 for convenient installation of the lamps onto the power distribution board 104 (shown in FIG. 1). Since the lamp 101 does not include a base portion, the area dedicated to the base portion, indicated as "A" in FIG. 2, is reduced such that the distance between the lead 202 and the lamphead assembly 103 is less than 1 mm in some embodiments. With the reduced area "A," the cooling of the lamphead assembly 103 is more efficient, since less cooling gas, such as helium gas, is used. A cooling channel 205 may be formed in the lamphead assembly 103 for allowing a coolant to flow therethrough.

The lamphead assembly 103 may be made of a metallic material and may be grounded. The risk of arcing between the grounded lamphead assembly 103 and the lead 202 is increased as the distance between the lead 202 and the lamphead assembly 103 is reduced. In addition, common inert gases used for controlling the pressure inside the lamphead assembly 103 and for cooling the lamphead assembly 103 may have a low break down voltage at a low pressure, such as between about $1\times10^{-5}$ Torr and about 10 Torr. A conventional lamp driver directly operating at 480 $V_{rms}$ alternating current (AC) may provide an electrical potential between the lamps and the lamphead assembly of about 350 V, which may exceed the minimum break down voltage of the inert gas used to control the pressure inside the lamphead assembly at a low pressure, such as between about $1\times10^{-5}$ Torr and about 10 Torr. To reduce the electrical potential between the baseless lamps 101 and the lamphead assembly 103, the one or more lamp drivers 114 are utilized.

Figure 3:
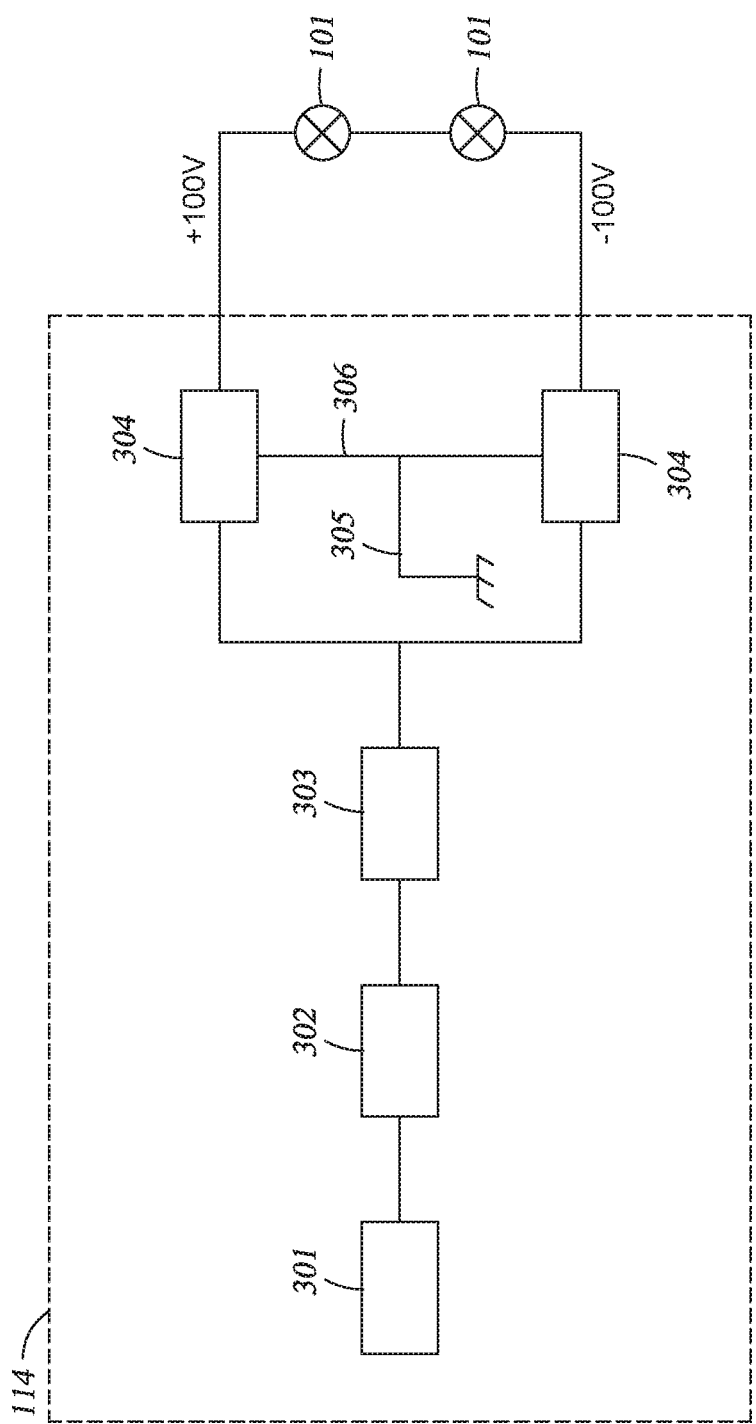
FIG. 3 is a circuit diagram of a lamp driver according to one embodiment.

FIG. 3 is a circuit diagram of the lamp driver 114 according to one embodiment. The lamp driver 114 includes a power source 301, at least two direct current to direct current (DC/DC) converters 304, each DC/DC converter 304 is connected with the power source 301 in series, a direct connection 306 between the DC/DC converters 304, and a line 305 that is attached to the direct connection 304 and attachable to a reference voltage, such as the ground. In one embodiment, the line 305 is connected to a center point of the direct connection 304 between the DC/DC converters 304. In other embodiments, the line 305 is displaced from the center point between the DC/DC converters 304. The lamp driver 114 may also include a rectifier 302, and a pulse width modulator 303. The power source 301 may provide AC power, which may have one or more phases, such as three phases. In one embodiment, the power source 301 provides 480 $V_{rms}$ of AC power. The rectifier 302 converts the AC voltage from the power source 301 to direct current (DC) voltage, i.e., "rectifies" the AC voltage to DC voltage. In one embodiment, the power source 301 is a 480 $V_{rms}$ AC power source and the rectifier 302 rectifies the 480 V AC to 700 V DC.

After the power is converted to DC voltage, the DC/DC converters 304, which may be step-down DC/DC converters, such as Buck converters, reduces the DC voltage to a reduced DC voltage, which is then supplied to the lamps 101. In one embodiment, at least two lamps 101 connected in series are connected to one lamp driver 114. Each lamp 101 may be a halogen lamp having a voltage rating between about 80 V and about 120 V, such as about 100 V. In another embodiment, each lamp 101 of the plurality of lamps 101 is connected to one lamp driver 114. The reduced DC voltage supplied to the lamps 101 can lower the electrical potential between the lamps 101 and the lamphead assembly 103. As shown in FIG. 3, the maximum electrical potential between the lamps 101 and the lamphead assembly 103 is about 100 V, which is significantly less than the electrical potential provided by a conventional lamp driver. At about 100 V, which is less than the minimum break down voltage of common inert gases, such as helium gas, the risk of arcing between the lamps and the lamphead assembly 103 is reduced.

Figure 4:
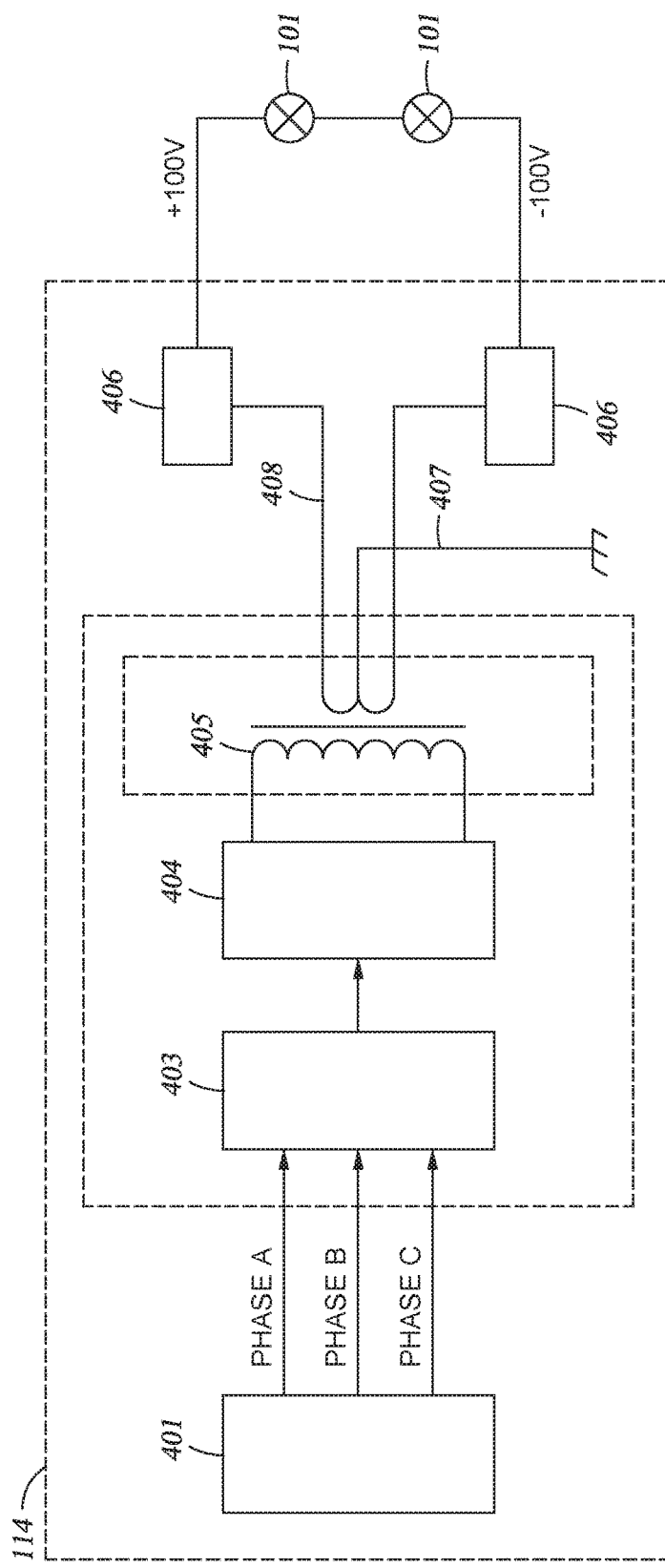
FIG. 4 is a circuit diagram of a lamp driver according to another embodiment.

FIG. 4 is a circuit diagram of the lamp driver 114 according to another embodiment. The lamp driver 114 includes a power source 401, at least two DC/DC converters 406, each DC/DC converter 406 is connected with the power source 401 in series, a direct connection 408 between the DC/DC converters 406, and a line 407 that is attached to the direct connection 408 and attachable to a reference voltage, such as the ground. In one embodiment, the line 407 is connected to a center point on the direct connection 408 between the DC/DC converters 406. In other embodiments, the line 407 is displaced from the center point between the DC/DC converters 406. The lamp driver 114 may also include a rectifier 403, a pulse width modulator 404, and a transformer 405. The power source 401 may be a three phase AC power source. The rectifier 403 may be the same as the rectifier 302 described in FIG. 3. In one embodiment, the power source 401 is a three phase 480 V AC power source and the rectifier 302 rectifies the 480 V AC to 700 V DC.

After the power is converted to DC voltage, the DC/DC converters 406, which may be the same as the DC/DC converters 304, reduce the DC voltage to a reduced DC voltage, which is then supplied to the lamps 101. In one embodiment, at least two lamps 101 connected in series are connected to one lamp driver 114. In another embodiment, each lamp 101 of the plurality of lamps 101 is connected to one lamp driver 114. The reduced DC voltage supplied to the lamps 101 can lower the electrical potential between the lamps 101 and the lamphead assembly 103. As shown in FIG. 4, the maximum electrical potential between the lamps 101 and the lamphead assembly 103 is about 100 V, which is significantly less than the electrical potential provided by a conventional lamp driver. At about 100 V, which is less than the minimum break down voltage of common inert gases, such as helium gas, the risk of arcing between the lamps and the lamphead assembly 103 is reduced.

Figure 5:
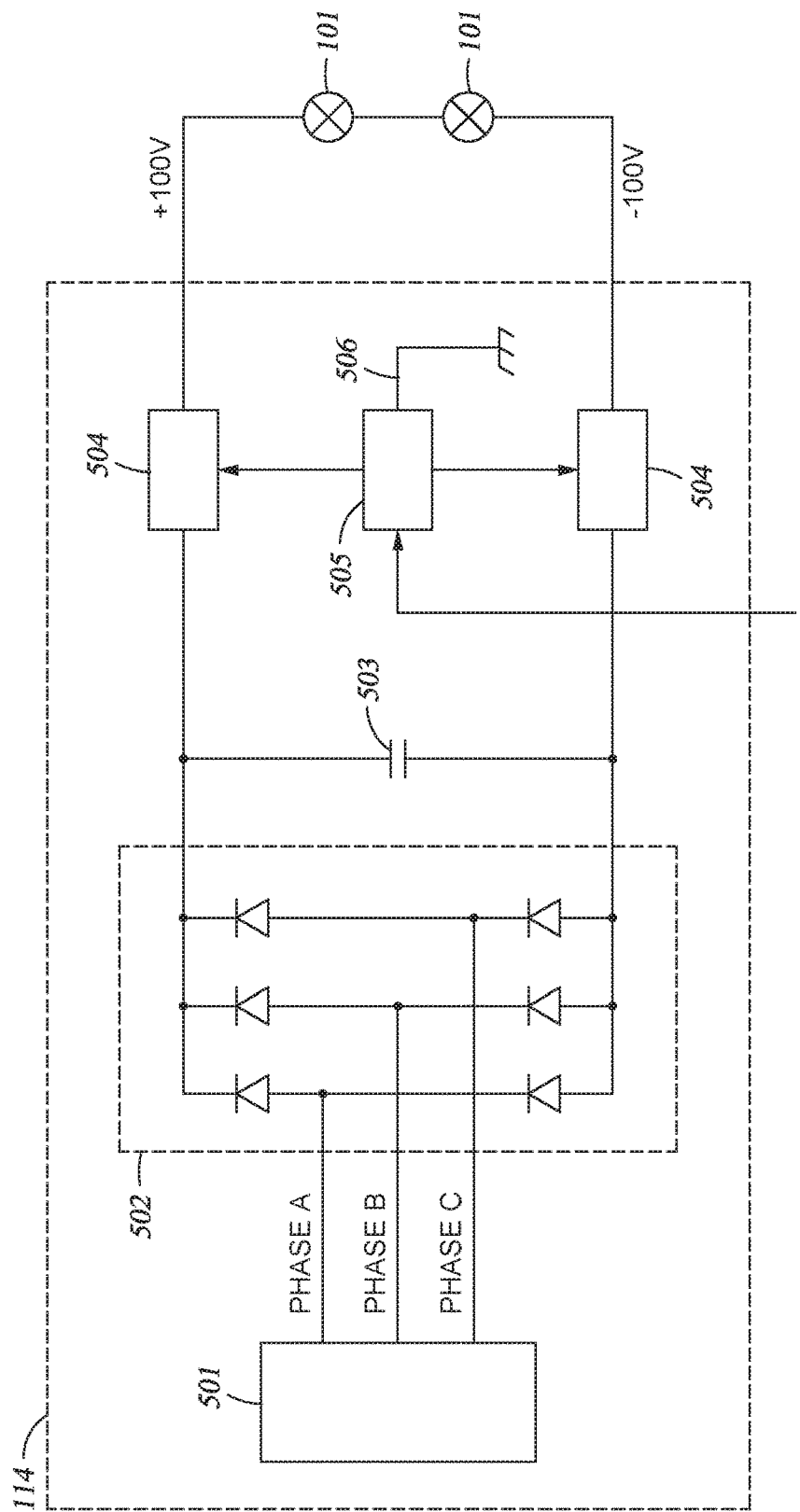
FIG. 5 is a circuit diagram of a lamp driver according to another embodiment.

FIG. 5 is a circuit diagram of the lamp driver 114 according to another embodiment. The lamp driver 114 includes a power source 501, at least two DC/DC converters 504, and each DC/DC converter is connected with the power source 501 in series. The at least two DC/DC converters 504 may be both connected to a controller 505, and a line 506 may be attached to the controller 505 and attachable to a reference voltage, such as the ground. In one embodiment, the controller 505 is positioned at a center point between the DC/DC converters 504. In other embodiments, the grounded controller 505 is displaced from the center point between the DC/DC converters 504. The lamp driver 114 may also include a rectifier 502, and a filter 503. The power source 501 may be the same as the power source 401 described in FIG. 4. The rectifier 502 may be a bridge rectifier. In one embodiment, the power source 501 is a three phase 480 $V_{rms}$ AC power source and the rectifier 502 rectifies the 480 V AC to 700 V DC. The DC voltage rectified by the rectifier 502 is then filtered by the filter 503.

The filtered DC voltage is then stepped-down by the DC/DC converters 504, which may be the same as the DC/DC converters 304, to a reduced DC voltage, which is then supplied to the lamps 101. In one embodiment, at least two lamps 101 connected in series are connected to one lamp driver 114. In another embodiment, each lamp 101 of the plurality of lamps 101 is connected to one lamp driver 114. The reduced DC voltage supplied to the lamps 101 can lower the electrical potential between the lamps 101 and the lamphead assembly 103. As shown in FIG. 5, the maximum electrical potential between the lamps 101 and the lamphead assembly 103 is about 100 V, which is two times less than the electrical potential provided by a conventional lamp driver. At about 100 V, which is less than the minimum break down voltage of common inert gases, such as helium gas, the risk of arcing between the lamps and the lamphead assembly 103 is reduced.

The one or more lamp drivers described herein help reducing the electrical potential between lamps and the grounded lamphead assembly that the lamps are positioned therein, which allows the reduction in distance between lamps and the grounded lamphead assembly without the risk of arcing. The one or more lamp drivers described herein can be used for powering halogen lamp based heaters for any suitable low pressure application.

While the foregoing is directed to embodiments of the present invention, other and further embodiments of the invention may be devised without departing from the basic scope thereof, and the scope thereof is determined by the claims that follow.

The invention claimed is:

1. A thermal processing apparatus, comprising:
 a plurality of lamps positioned in a lamphead assembly, wherein each lamp of the plurality of lamps includes a bulb portion and a lead extending through an area dedicated to a base portion in the lamphead assembly, and a distance between the lead and the lamphead assembly within the area dedicated to the base portion is less than 1 mm; and
 one or more lamp drivers, wherein each lamp driver of the one or more lamp drivers is connected to one or more lamps of the plurality of lamps, and wherein the one or more lamp drivers each includes:
  a power source;
  at least two direct current to direct current converters, each direct current to direct current converter connected with the power source in series; and
  a direct connection between the at least two direct current to direct current converters, wherein the direct connection is attachable to a reference voltage by a line located at a center point of the direct connection.

2. The thermal processing apparatus of claim 1, wherein each of the one or more lamp drivers further comprises a rectifier.

3. The thermal processing apparatus of claim 2, wherein each of the one or more lamp drivers further comprises a pulse width modulator.

4. The thermal processing apparatus of claim 2, wherein each of the one or more lamp drivers further comprises a transformer.

5. The thermal processing apparatus of claim 2, wherein the power source is a three phase alternating current power source.

6. The thermal processing apparatus of claim 2, wherein the rectifier is a bridge rectifier.

7. A method for powering a plurality of lamps positioned in a lamphead assembly, comprising:
 converting a 480 V alternating current voltage from a power source to a direct current voltage;
 reducing the direct current voltage to a reduced direct current voltage using at least two direct current to direct current converters, wherein each direct current to direct current converter is connected with the power source in series, and wherein a direct connection between the at least two direct current to direct current converters is connected to a reference voltage by a line located at a center point of the direct connection; and
 supplying the reduced direct current voltage to one or more lamps of the plurality of lamps positioned in a lamphead assembly, wherein each lamp of the plurality of lamps includes a bulb portion and a lead extending through an area dedicated to a base portion in the lamphead assembly, and a distance between the lead and the lamphead assembly within the area dedicated to the base portion is less than 1 mm, wherein a maximum electrical potential between the plurality of lamps and the lamphead assembly is about 100 V.

8. The method of claim 7, further comprising flowing an inert gas into the lamphead assembly, wherein a pressure inside the lamphead assembly is between about $1\times10^{-5}$ Torr and about 10 Torr.

9. The method of claim 8, wherein the inert gas is helium gas.

10. The method of claim 7, further comprising flowing a coolant through the lamphead assembly.

11. The method of claim 10, wherein the coolant is water.

* * * * *